(12) United States Patent
Saha et al.

(10) Patent No.: US 9,597,833 B2
(45) Date of Patent: Mar. 21, 2017

(54) BIAXIAL TENSILE STAGE FOR FABRICATING AND TUNING WRINKLES

(71) Applicants: Sourabh Kumar Saha, Newton, MA (US); Martin Luther Culpepper, Georgetown, MA (US)

(72) Inventors: Sourabh Kumar Saha, Newton, MA (US); Martin Luther Culpepper, Georgetown, MA (US)

(73) Assignee: Sourabh Kumar Saha, Livermore, CA (US)

( * ) Notice: Subject to any disclaimer, the term of this patent is extended or adjusted under 35 U.S.C. 154(b) by 266 days.

(21) Appl. No.: 14/590,448

(22) Filed: Jan. 6, 2015

(65) Prior Publication Data

US 2015/0202821 A1    Jul. 23, 2015

Related U.S. Application Data

(60) Provisional application No. 61/923,912, filed on Jan. 6, 2014.

(51) Int. Cl.
  *B29C 55/12*    (2006.01)
  *B29C 55/20*    (2006.01)
  *B29K 83/00*    (2006.01)

(52) U.S. Cl.
  CPC .............. *B29C 55/12* (2013.01); *B29C 55/20* (2013.01); *B29K 2083/00* (2013.01)

(58) Field of Classification Search
  CPC ....... B29C 55/10; B29C 55/20; B29C 55/165; B29C 51/262; G01N 2203/0254; G01N 3/08; G01N 3/04; G01N 2203/0016; G01N 2203/0017; G01N 2203/0256; G01N 3/32; B29K 2027/18; B29L 2031/756; Y10S 425/053; B41F 15/36; B41F 27/1281; B44D 3/185; B44D 3/18; B41N 1/248; G09F 15/0025; E05C 9/02
  USPC .......... 425/DIG. 53, 383, DIG. 48, 391, 394, 425/397, 400, 404; 428/152; 73/813, 73/818, 831, 856, 857; 264/220, 288.4,
  (Continued)

(56) References Cited

U.S. PATENT DOCUMENTS 3,579,718 A   5/1971 Miller et al.
5,162,008 A   11/1992 Steiner et al.
(Continued)

OTHER PUBLICATIONS

Stafford, Christopher M., et al. "Combinatorial and high-throughput measurements of the modulus of thin polymer films." Review of Scientific Instruments 76.6 (2005): 062207.*

*Primary Examiner* — Matthew Daniels
*Assistant Examiner* — Leith S Shafi (57) ABSTRACT

Wrinkling of thin films is a strain-driven process that enables scalable and low-cost fabrication of periodic micro and nano scale patterns. However, real-world application is limited by the inability of current tools to provide the means for applying large, accurate, and non-equal biaxial strains via a device that can fit within the vacuum chambers that are required for thin film deposition/growth during wrinkling. The present biaxial tensile stage is a compact system that enables one to apply large and accurate non-equal biaxial strains to elastomeric films. It consists of (i) fixtures to clamp and hold films onto the stage, (ii) linear bearings for motion guidance, (iii) integrated actuators for real-time stretch control, (iv) base with kinematic coupling for registration to a metrology system, and (v) the structural frame.

13 Claims, 10 Drawing Sheets

(58) Field of Classification Search
USPC ............ 264/290.2, 291, 322; 427/171;
101/127.1, 415.1; 160/378, 374, 328,
160/372; 38/102.5, 102.3, 102, 102.4
See application file for complete search history.

(56) References Cited

U.S. PATENT DOCUMENTS

| | | |
|---|---|---|
| 5,468,138 A | 11/1995 | Bosse et al. |
| 6,247,370 B1 | 6/2001 | Ramaswamy et al. |
| 6,487,902 B1 | 12/2002 | Ghosh et al. |
| 6,860,156 B1 | 3/2005 | Cavallaro et al. |
| 7,712,379 B2 * | 5/2010 | Abu-Farha ............ G01N 3/04 73/856 |
| 7,762,146 B2 | 7/2010 | Brodland |
| 7,978,416 B2 | 7/2011 | Crosby et al. |
| 8,141,855 B2 | 3/2012 | McCracken et al. |
| 8,641,408 B2 | 2/2014 | Collin |
| 2005/0023729 A1 | 2/2005 | Smith et al. |
| 2009/0297776 A1 | 12/2009 | Crosby et al. |
| 2012/0015149 A1 * | 1/2012 | Keefe ............... B29C 59/02 428/152 |
| 2014/0017454 A1 | 1/2014 | Boyce et al. |
| 2014/0199518 A1 | 7/2014 | Yu et al. |

\* cited by examiner

BIAXIAL TENSILE STAGE FOR FABRICATING AND TUNING WRINKLES

BACKGROUND OF THE INVENTION

This invention relates to a biaxial tensile stage and more particularly to such a stage for fabrication and tuning of micro and nano scale wrinkle patterns that are generated upon compression of thin films.

Wrinkling is a strain-driven self-organization phenomenon that is commonly observed in natural systems over a wide length scale. Recently, this phenomenon has been incorporated into engineered systems to generate micro and nano scale patterns. For example, wrinkling of bilayer materials has been used to fabricate periodic sinusoidal patterns for thin film metrology, stretchable electronics, and microfluidics applications. Due to its inherent affordability and manufacturing scalability, pattern generation via wrinkling is an attractive potential alternative to more expensive cleanroom-based techniques such as e-beam lithography. However, practical import of this process is limited by the lack of flexibility, i.e., due to the inability to fabricate a variety of complex 2-D patterns. This is due to the limited ability of current tensile stages to provide the means to apply large, accurate, and/or non-equibiaxial strains within a small footprint. It is the goal of this invention to provide such a stage thereby enabling one to explore and access a wider design space for fabricating and tuning wrinkled patterns.

Figure 1A:
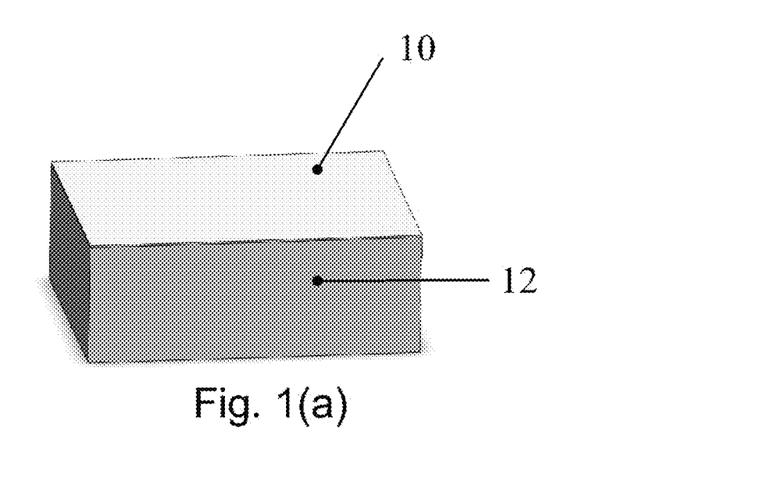
FIGS. 1(a) and 1(b) are schematic illustration of wrinkle formation during compression of a bilayer film.
Figure 1B:
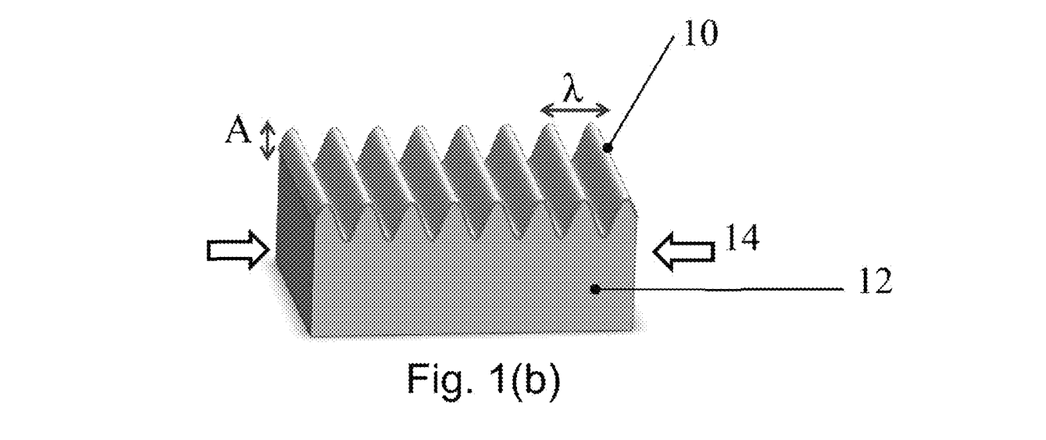
Figure 2A:
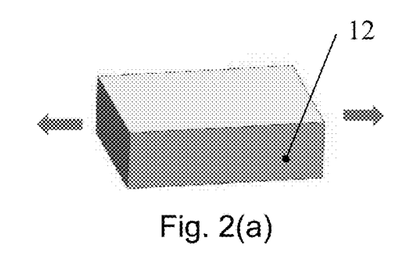
FIG. 2(a) illustrates stretching of PDMS base.
Figure 2B:
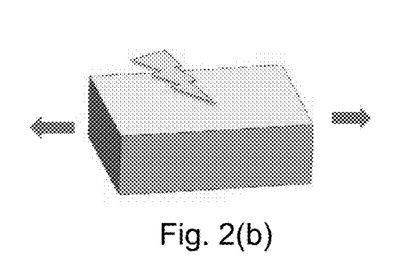
FIG. 2(b) illustrates plasma oxidation.
Figure 2C:
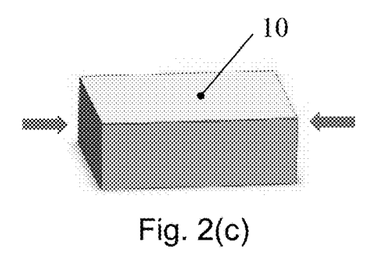
FIG. 2(c) illustrates release of pre-stretch.
Figure 2D:
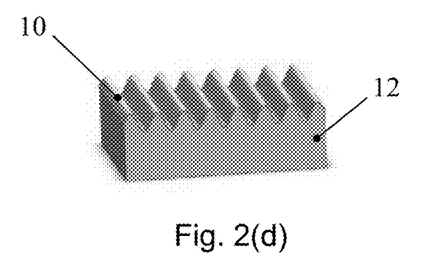
FIG. 2(d) illustrates the resulting wrinkle pattern.

Wrinkles in compressed bilayer systems are formed due to buckling-based instabilities. The mechanism of wrinkling is similar to Euler buckling of columns under compression. A schematic of this process is illustrated in FIG. 1. Essential elements of these bilayer systems are: (i) a film 10 that is thin relative to the base, (ii) mismatch in the elastic moduli of the film and the base 12 with the film being stiffer than the base, and (iii) loading conditions 14 that generate in-plane compressive strain in the film. In such systems, the state of pure compression becomes unstable beyond a critical strain and wrinkles are formed via periodic bending of the film/base. The period of wrinkles ($\lambda$) is determined by the competing dependence of strain energy on period in the film versus in the base. The amplitude (A) is determined by the amount of applied compressive strain. Several different techniques have been developed in the past to (i) generate and join/bond the film to the base, (ii) generate moduli mismatch, and (iii) apply uniaxial and equibiaxial strains to the film. Analytical and computational predictive models for uniaxial and equibiaxial strains have also been developed. As such, these techniques and models provide a framework for performing predictive design and fabrication of periodic wrinkle patterns.

Although current techniques and models are a valuable toolkit for predictive design and fabrication of wrinkled patterns, they are still inadequate in satisfying the need for a variety of different complex patterns. This is primarily because only a small subset of the feasible design space is accessible via existing experimental techniques. The set of wrinkle patterns that can be fabricated is limited by the achievable range and types of compressive strains. For example, (i) below a threshold strain, only the single-period sinusoidal mode can be achieved via uniaxial strains and (ii) only a limited set of symmetric 2-D modes can be achieved via equibiaxial strains. Existing techniques that rely on thermal expansion or volumetric swelling to generate strains can provide only a limited set of strain states. For example, mismatched thermal expansion of an isotropic film on an isotropic base generates equibiaxial strains. Due to this, exploring the design space for large uniaxial or non-equibiaxial strains becomes a material selection problem. This coupling between strain and materials can be eliminated by using mechanical stages to introduce strains via stretching of the base layer. However, existing biaxial mechanical stages are often too large to use within vacuum chamber based equipment that are necessary for generation of thin films during wrinkle fabrication. Thus, there is a need to develop a mechanical stage that has a small form factor and provides the means to apply large, accurate, and non-equibiaxial strains.

Compact mechanical stages that are capable of providing large non-equibiaxial strains become a necessity when a variety of complex wrinkle patterns are required. The present biaxial tensile stage is compact and is capable of providing uniaxial and sequential non-equibiaxial stretching. The stage also has alignment features that enable one to register it to a vision system. This enables performing real-time in-situ visualization of the wrinkles as stretches are varied. Thus, this system is (i) an effective tool to experimentally study and characterize wrinkle formation and (ii) manufacturing equipment for low-cost fabrication of micro and nano scale patterns. By enabling fabrication of complex micro and nano scale patterns, this system reduces the overall cost of manufacturing micro and nano-enabled products by a factor of at least 10.

SUMMARY OF THE INVENTION

The biaxial stage according to the invention consists of: (i) fixtures to clamp and hold films onto the stage, (ii) linear bearings for motion guidance, (iii) actuators for stretch/displacement control, (iv) base with kinematic coupling for registration, and (v) the structural frame. The purpose of the film clamping fixtures is to hold the edges of the film stationary along the actuated direction while allowing for motion along the orthogonal in-plane direction. To enable control of film stretch, the stage platforms were mounted on linear bearings and actuated individually and manually by micrometer heads. The purpose of kinematic couplings in the base is to implement an accurate and quick attach/detach mechanism to register the stage to the metrology frame. The purpose of the structural frame is to maintain structural rigidity and provide alignment features for assembling the modules of the stage.

The essential design features that ensure that the stage satisfies the functional requirements imposed by the wrinkling process are: (i) the actuator was integrated onto the stage to enable real-time tuning of wrinkles, (ii) non-essential motion guidance elements were eliminated to reduce the size of the stage, and (iii) a mechanism for quick and accurate registration of the stage to the vision system was implemented to enable in-situ imaging. In the present stage, integrated onboard actuation was achieved by using manually-actuated micrometer heads that were mounted on the stage. To reduce the size of the stage, mechanical couplings between the actuators and the movable platforms of the stage were eliminated; instead, the micrometer heads push directly onto the stage platforms during actuation. Additionally, a kinematic coupling was built into the base of the stage to quickly and accurately register the stage to a vision system.

BRIEF DESCRIPTION OF THE DRAWINGS

FIGS. 2(a), 2(b), 2(c), and 2(d) are schematic illustration of the process of wrinkle fabrication via a pre-stretch based film compression technique.

FIGS. 8(a) and 8(b) are illustration of the application of the tensile stage for fabrication of wrinkle patterns.

DESCRIPTION OF THE PREFERRED EMBODIMENT

To enable the fabrication and tuning of wrinkle patterns, one must solve these sub-problems: (i) fabrication of a bilayer system with the desired material properties and geometry, (ii) compression of the top stiff film, and (iii) in-situ visualization of pattern formation.

Stretchable bilayers with large stiffness ratio can be fabricated by attaching or growing a thin stiff film 10 on top of a thick elastomeric base 12. For example, exposing a polydimethylsiloxane (PDMS) film to air or oxygen plasma leads to the formation of a thin glassy layer on top of the exposed PDMS surface via oxidation. Alternatively, a metallic or polymeric thin film may be deposited on top of PDMS to obtain the desired bilayer. The top layer thickness can be tuned by controlling the duration of plasma oxidation or the deposition process; whereas the stiffness ratio may be tuned by selecting the appropriate top/bottom materials. The preferred embodiment of the stage can be used with both plasma oxidation and metal/polymer film deposition techniques to generate a stiff thin film on top of an elastomeric PDMS layer.

Compression of the top film can be achieved by either directly compressing the bilayer or by generating a residual compressive strain in the top layer. As direct compression requires sustained loading to maintain the wrinkles, residual compression is often the preferred scheme. During mechanical loading, residual compression can be generated by first stretching the PDMS base and then attaching/growing the stiff film on top of this pre-stretched base layer. On releasing the prestretch in the PDMS, the top layer undergoes compression that leads to formation of wrinkles. The preferred embodiment of this stage can be used to implement this prestretch-based technique to generate compressive strains in the thin film.

The morphology of wrinkles depends on both the magnitude and the nature of compressive strains that are applied to the thin film. The nature of the applied strain can be classified into three different types: (i) equibiaxial, (ii) uniaxial, and (iii) sequential biaxial. Equibiaxial strains lead to 2-D periodic morphologies such as triangular, hexagonal, square checkerboard, and zigzag modes whereas uniaxial strain leads to 1-D sinusoidal patterns. For both of these types of strains, the morphology of wrinkles also changes when the compressive strain is progressively increased. During uniaxial loading, this change occurs as a transition from a single-period sinusoidal mode to higher modes of successive period-doubling bifurcations. During equibiaxial loading, the change occurs as transition to a more energetically favorable morphology for the corresponding strain.

The effects of equibiaxial and uniaxial strains have been extensively studied in the past due to the relative ease of access to equipment/techniques. However, due to lack of appropriate biaxial tensile stages the effect of sequential biaxial loading is not well understood. Past studies demonstrate that stepwise loading, i.e., loading along one axis followed by loading along the orthogonal axis leads to preferential selection of the zigzag mode. This suggests dependence of morphology on loading path in addition to the magnitude and nature of the strains. However, this path dependence hypothesis is experimentally unverifiable in the absence of tools to apply loads along different paths. In fact, a majority of the design space remains unexplored due to the lack of experimental tools. The present biaxial tensile stage enables one to explore this design space.

The steps of the wrinkle fabrication process are illustrated in FIGS. 2(a), 2(b), 2(c), and 2(d). The steps are (i) fabricating the base PDMS film 12, (ii) clamping the PDMS film in the tensile stage, (iii) extension of the PDMS film, (iv) plasma oxidation of the stretched PDMS film or deposition of metallic/polymeric thin film 10, and (v) release of the prestretch in the PDMS film. The role of the biaxial tensile stage is to provide the means to (i) control the stretch in the PDMS base layer, (ii) hold the prestretch during plasma oxidation or metal/polymer deposition, and (iii) perform a controlled release of the prestretch. Wrinkle patterns are obtained upon partial or full release of the pre-stretch. Additionally, the stage must have alignment features to register itself to a vision system both before and after plasma oxidation to enable in-situ visualization of wrinkle formation. The present stage satisfies all of these requirements.

Figure 3A:
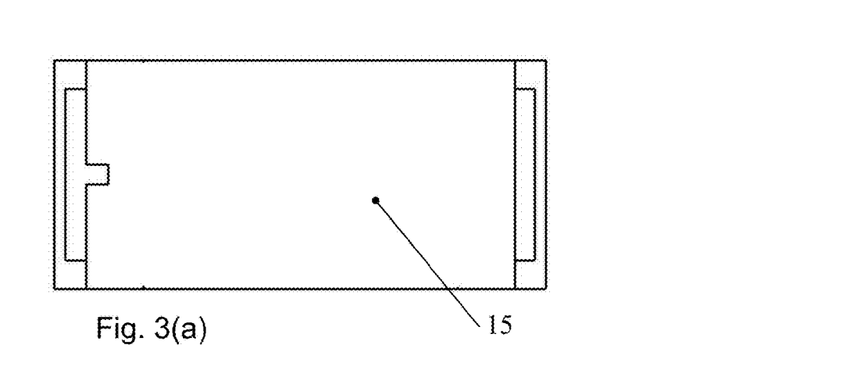
FIGS. 3(a) and 3(b) are top and front side views of a film for uniaxial stretching.
Figure 3B:
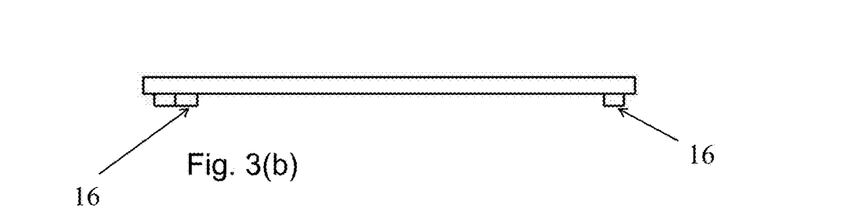
Figure 3C:
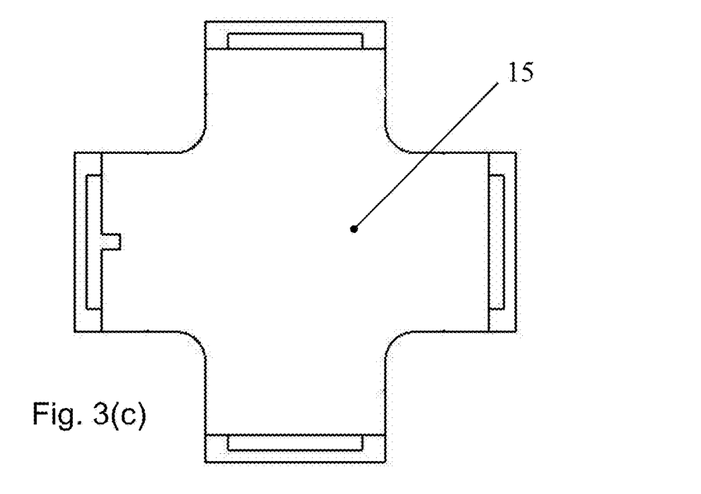
FIGS. 3(c) and 3(d) are top and front side views of a film for biaxial stretching.
Figure 3D:
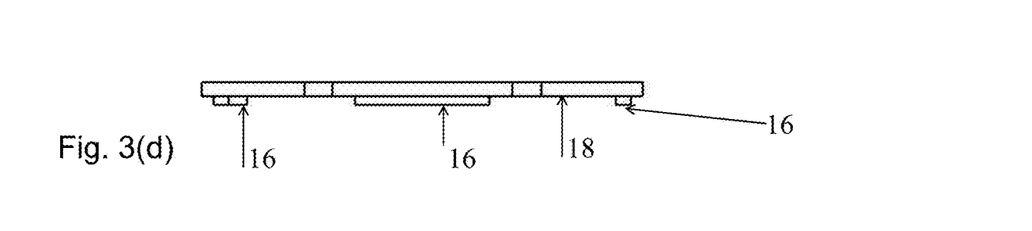

As the size of the motion stage scales with the size of the PDMS films 15 being stretched, it is necessary to select the size of the PDMS films before designing the stage. For this embodiment, the size of the films was determined by microfluidics-based applications wherein the chip/device is about a cm to an inch square. Rectangular films were selected for uniaxial stretching films and symmetric cross-shaped films were selected for biaxial stretching. These films are illustrated in FIGS. 3(a) and 3(b). The stretched length is 37.5 mm for rectangular films and 43 mm for cross-shaped films, clamped width is 20 mm, and the film thickness varies from 1.9-2.2 mm. The PDMS films were fabricated by thermally curing the commercially available Sylgard 184 two-part silicone elastomer mixture in a ratio of 1 part curing agent to 12 parts resin by weight. Details of the curing protocol are found in "Saha, S. K., 2014, Predictive Design and Fabrication of Complex Micro and Nano Patterns Via Wrinkling for Scalable and Affordable Manufacturing, Ph.D. thesis, Massachusetts Institute of Technology, Cambridge, Mass.", the contents of which are incorporated herein by reference. To align the edges of the film to the alignment edges 21 on the clamps, alignment features 16 were generated on the bottom surfaces 18 of the films by incorporating them directly into the molds used for curing. These alignment features ensure that the length of the stretched section is accurately known during stretching.

Figure 4A:
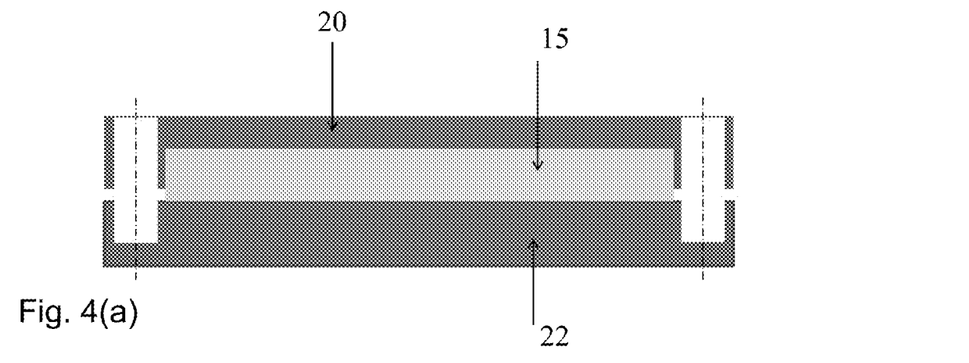
FIGS. 4(a) and 4(b) are cross-sectional and perspective views, respectively, of the film clamping mechanism in an embodiment of the biaxial tensile stage disclosed herein.
Figure 4B:
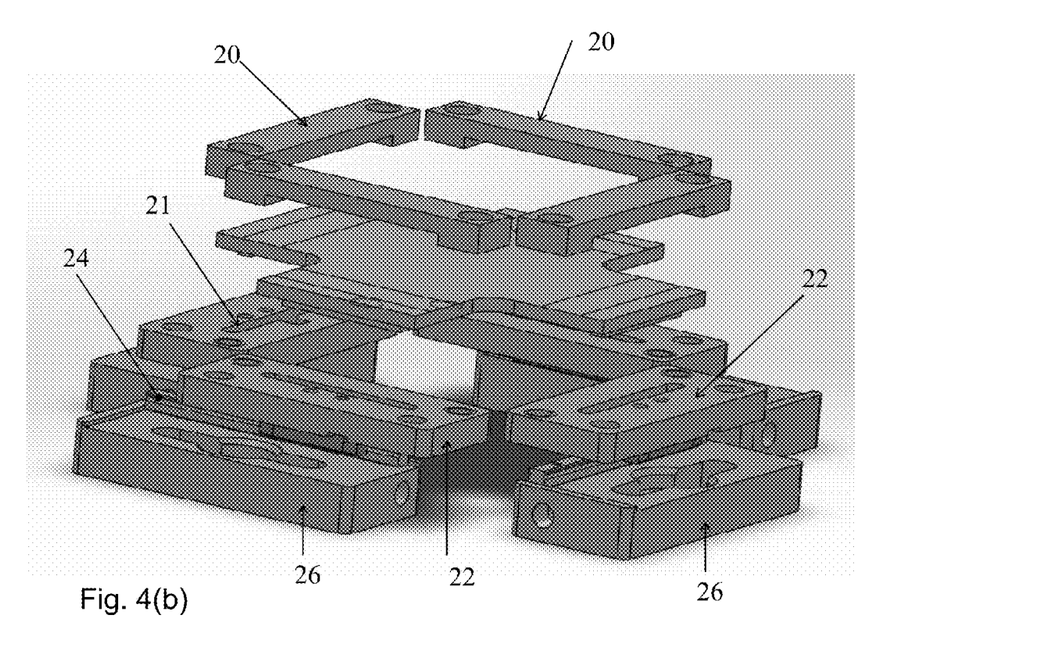

The PDMS films 15 are held onto the stage platforms via custom-made compression clamps that are illustrated in FIG. 4. These clamps were designed to provide a repeatable and sufficiently high compression during clamping. Each clamp consists of a set of two parts 20 and 22 that when bolted together leave a fixed gap between the two. The gap between the two parts is designed to be smaller than the thickness of the PDMS films. Thus, when the PDMS film is clamped between these parts, the amount of clamping compression in the film is repeatable and is determined by the difference in the film thickness and the predetermined gap between the parts.

To avoid over-constraint during biaxial stretching, it is necessary to allow for the movement of the edges along the non-actuated direction. For example, edges oriented along the X direction must be free to move along the X axis whereas edges along the Y direction must be free to move along the Y axis. When all four edges are clamped, over-constraint can be avoided by implementing rolling boundary conditions at each edge. In this embodiment, these edge rolling conditions were implemented by introducing miniature linear ball bearings 24 between each of the clamp bottoms 22 and the corresponding platforms 26. The rail of the miniature bearings is rigidly attached to the stage platforms 26 and the guides of the miniature bearings is attached to the bottom half of the clamps 22. The miniature bearings are oriented along the edges, thereby allowing linear motion between the stage and the clamp along the edges. During biaxial loading, these roller bearings ensure that the stretches along the two axes are independent of each other.

Figure 5:
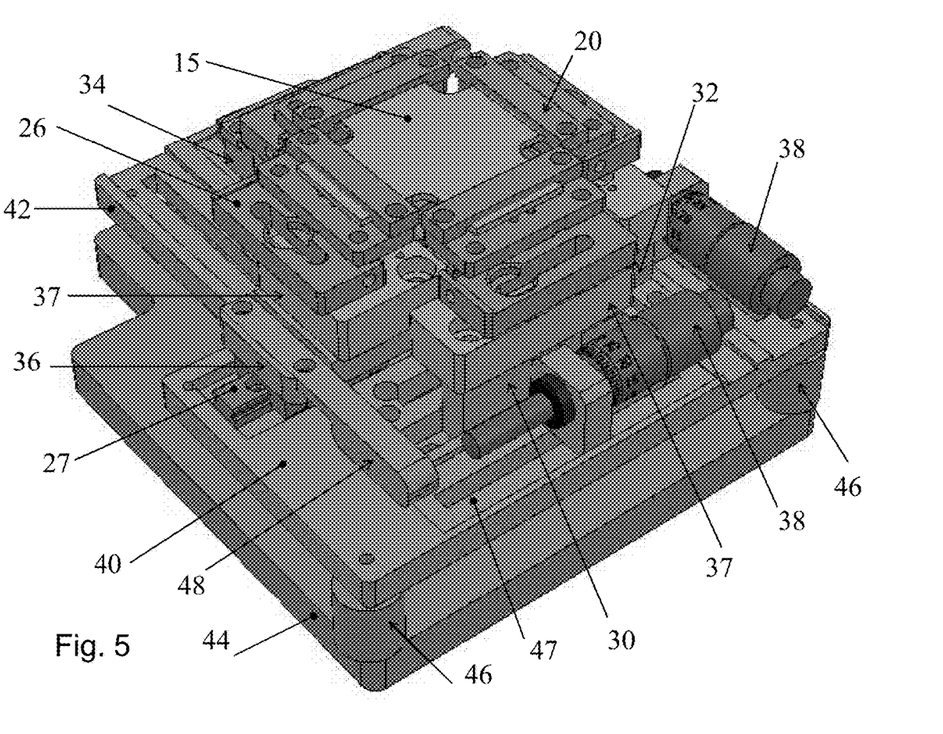
FIG. 5 is a perspective view of an embodiment of the biaxial tensile stage disclosed herein.
Figure 6A:
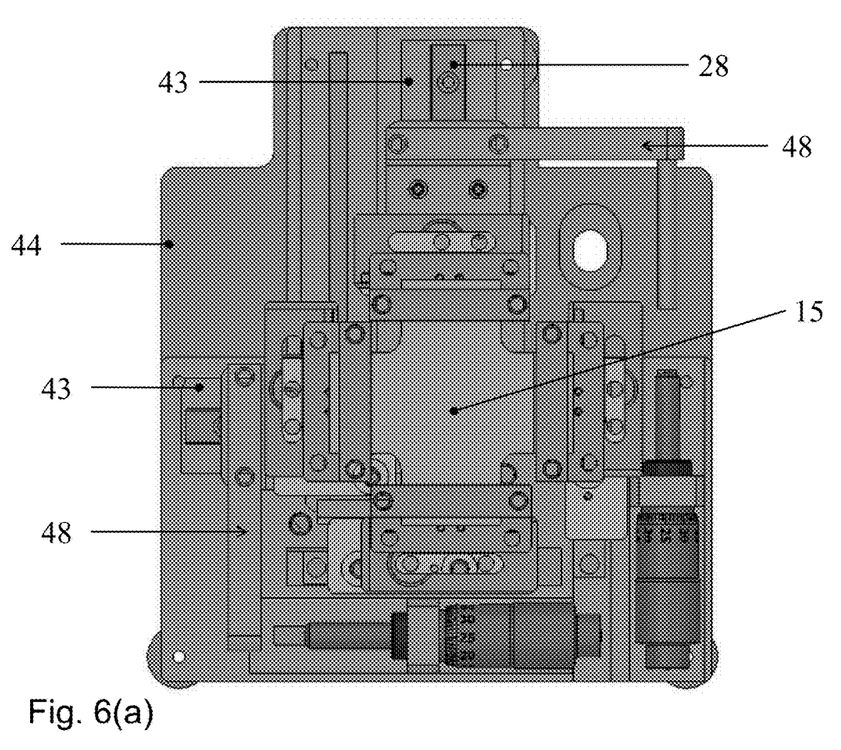
FIGS. 6(a), 6(b), and 6(c) are top, side, and front views, respectively, of an embodiment of the biaxial tensile stage disclosed herein.
Figure 6B:
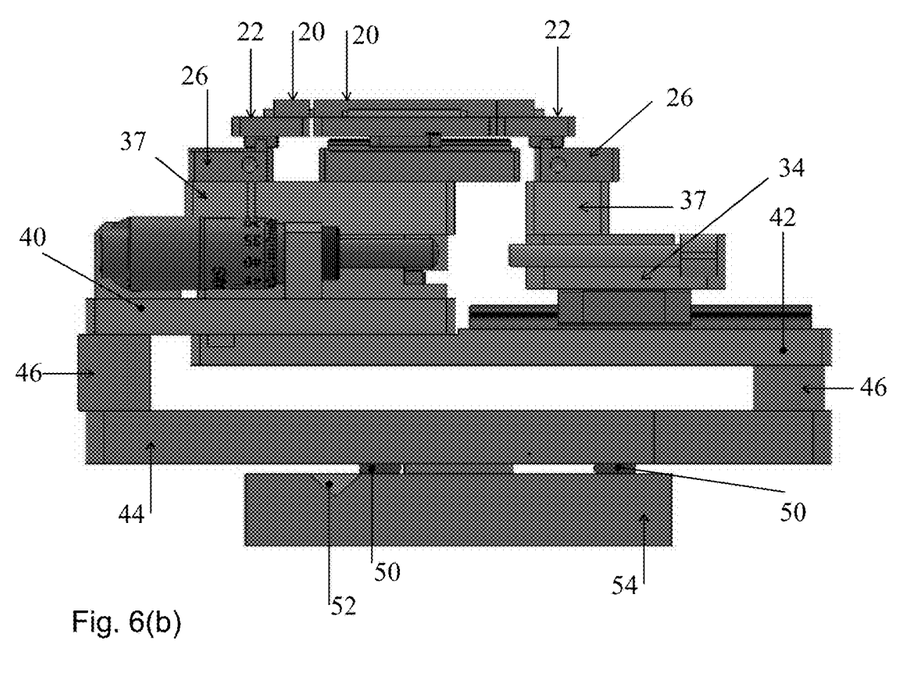
Figure 6C:
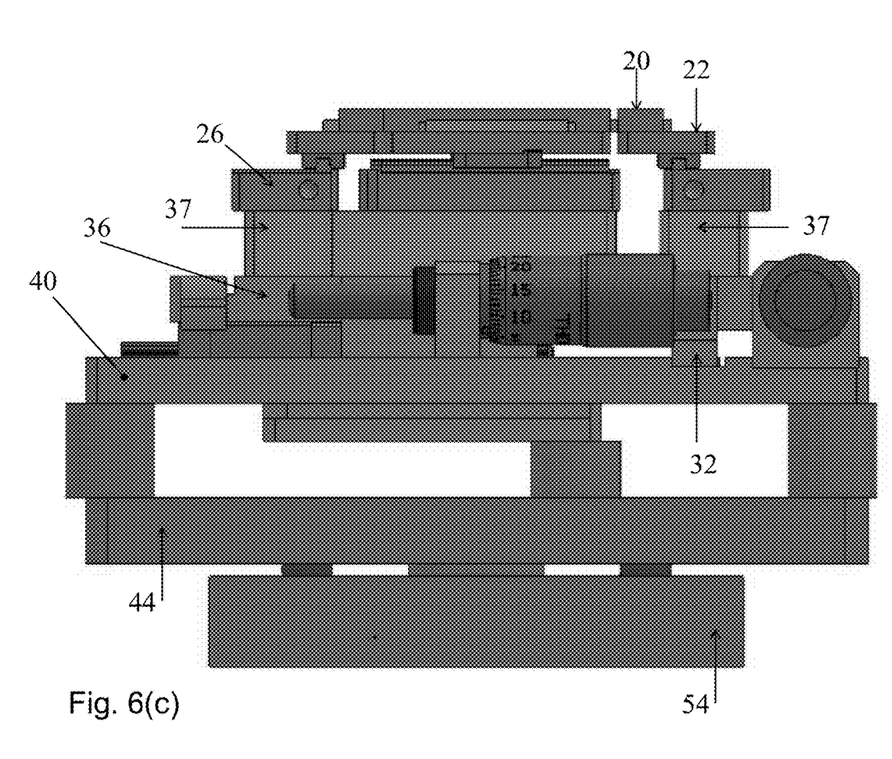

The purpose of the motion stage is to provide the desired stretching motion while minimizing the parasitic motions. Based on the tradeoff for range versus accuracy, linear bearings that are based on the ball guide and rail mechanism were selected to guide motion along the two axes. This mechanism is illustrated in FIG. 5 and FIGS. 6(*a*), 6(*b*), and 6(*c*). The linear bearings 27, 28 for the two axes are oriented perpendicular to each other and can be independently actuated to stretch the PDMS film 15. To stretch the film, two orthogonal edges of the film are clamped onto stationary platforms 30, 32 and the corresponding opposing edges are clamped onto the moving platforms 34, 36 that are mounted on the linear guides 28 and 27. Actuation of each moving platform is performed manually via micrometer heads 38. As the two axes can be independently actuated, the stage may be used for both uniaxial and biaxial stretching.

Machined alignment features and mating of precision machined surfaces were used to align and stack the two motion stages. Alignment features were used to perform in-plane alignment of (i) stationary platform perpendicular to the linear rail, (ii) actuation direction parallel to linear rails, and (iii) the two linear rails perpendicular to each other. To do so, linear bearings and the stationary platforms were first mounted and aligned onto separate base plates 40, 42 and then the two base plates were aligned to each other. On each plate, rail seat 43 was first machined out and then this seat was used as a reference for machining out all in-plane alignment features. To ensure that all of the moving and stationary platforms are at the same height to within ±25 um, the following measures were taken: (i) spacers 37 were placed on top of the platforms 30, 32, 34, 36 such that stacking of the components of each platform would lead to the same nominal height across all platforms and (ii) shim stock was used during assembly of the platforms. The two base plates 40, 42 where then bolted to the structural frame 44 with spacers 46 between them.

In this embodiment, micrometer heads 38 that are mounted in the grooves 47 on the base plates of the stage are used to manually and independently actuate the two movable stages. The position of the micrometer heads along these groves may be changed to tune the starting position of the actuation range. To reduce the overall size and to integrate the heads onto the stage, mechanical couplings between the micrometer heads and the movable platforms 34, 36 were eliminated. Instead, the micrometer heads push directly onto the extension arms 48 of the movable platforms. Each micrometer head sits in between the movable platforms and stationary platforms and sets the minimum distance between the two platforms. As the heads are not rigidly connected to the movable platforms, they are incapable of pulling the platforms. Therefore, during actuation the movable platforms are free to move away from the stationary platforms, but not toward them. When PDMS films are mounted onto the stage and stretched, tension in the film provides the restoring force to the actuation motion. This restoring force on the movable platform keeps it from moving further away while the platform's position is held by the micrometer head. The PDMS film can be stretched further by actuating the micrometer to push onto the movable platform; whereas the tension can be released by actuating the micrometer in the opposite direction. Thus, actuation of the micrometer head can be used to control the tensile stretching of the film but cannot be used to compress the base layer.

The unidirectional actuation capability of the stage can be used to accurately identify the zero stretch point during film stretching. During stretching and stretch release, the movable platform tracks the micrometer head and stays in contact with it as long as a non-zero restoring force due to tension exists. In this embodiment, this restoring force is measured as the contact force at the contact between the micrometer head and the movable stage using a force dependent resistor in half-bridge Wheatstone arrangement. The zero stretch point can then be identified within a tolerance band by measuring this contact force during stretching and stretch-release. For the present system, the smallest force that could be accurately measured was 100 mN. This corresponds to an error of 0.06% in the film strain. This zero error is about 2 to 5 times less than the critical strain for wrinkling bifurcation and is substantially less than the operating strains of 5-15%.

In this embodiment, passive thermal management schemes have been used to ensure that mechanical stretching is minimally distorted by thermal strains and to hold positional accuracy during imaging. The film generation step that consists of plasma oxidation is the primary source of heat during the process. Thermal errors during film generation can be managed by (i) performing intermittent plasma oxidation with a maximum continuous exposure time of five minutes to prevent overheating of the stage and (ii) limiting the rise in temperature by increasing the thermal mass of the stage. The thermal mass of the stage was increased by attaching strips of a phase change material with a transition temperature of 50° C. on the exposed surfaces of the stage. These two schemes minimize the thermal errors associated with the film generation process. After film generation, the stage is cooled down to room temperature before performing any subsequent operation. This ensures that heating of the stage has minimal influence on position measurements during imaging.

The goal of thermal strain management is to maintain the thermal strains lower than the critical wrinkling strain ($\epsilon_c$); under this condition, thermal strains alone would not lead to wrinkled surfaces. Due to the layout of the mechanical constraints, there is no thermal strain in the PDMS film due to thermal expansion of PDMS. As the stiffness of PDMS is at least three orders of magnitude less than the stiffness of the base/micrometer, all of the thermal strain in PDMS is due to expansion of the micrometer head and the base of the stage. Thus, the thermal strain ($\epsilon_t$) in the constrained PDMS film that arises due to a uniform temperature rise of $\Delta T$ is given by: $\epsilon_t = \Delta T(\alpha_a L_b + (L_s - L_b)\alpha_a)/L_s$ Here, $\alpha_s$ and $\alpha_b$ are the coefficient of linear thermal expansion of the actuator and the base, $L_s$ is length of the stretched PDMS film, and $L_b$ is the distance between the base of the actuator and the fixed platform. The temperature rise necessary for a thermal strain that is equal to the critical strain can be estimated from the following values: $L_s$=43 mm, $L_b$=18 mm, $\alpha_a$=13 e-6/K, $\alpha_b$=22.2 e-6/K, and $\epsilon_c$=0.1%. For these conditions, the maximum allowable rise in temperature of the stage is 59.3° C.

To verify the effectiveness of the thermal management scheme, temperature at various spots on the stage was measured after an unstretched PDMS film was exposed to air plasma for 90 minutes. The exposure cycle consisted of 5 minutes of continuous exposure followed by a five minute interval during which the plasma was switched off Immediately after cumulative plasma exposure of 90 minutes, temperature at various spots on the stage was measured using a thermocouple probe. Temperature was observed to vary within the range of 50-60° C. over the surface of the stage. The maximum temperature was observed on the clamps and the minimum temperature was observed on the exposed surface of the extension arm. The surface of the exposed PDMS film was examined under an atomic force microscope to verify that no wrinkles were formed under thermal strains; i.e., the thermal strains were lower than the critical strain. Under the AFM microscope, a flat non-wrinkled surface was observed that had a surface roughness (Ra) of 3.5 nm over a scanned area of 30 um×30 um. This justifies the approximation that the thermal strain on this tensile stage during plasma oxidation is negligible as compared to the strain due to mechanical stretching.

Figure 7:
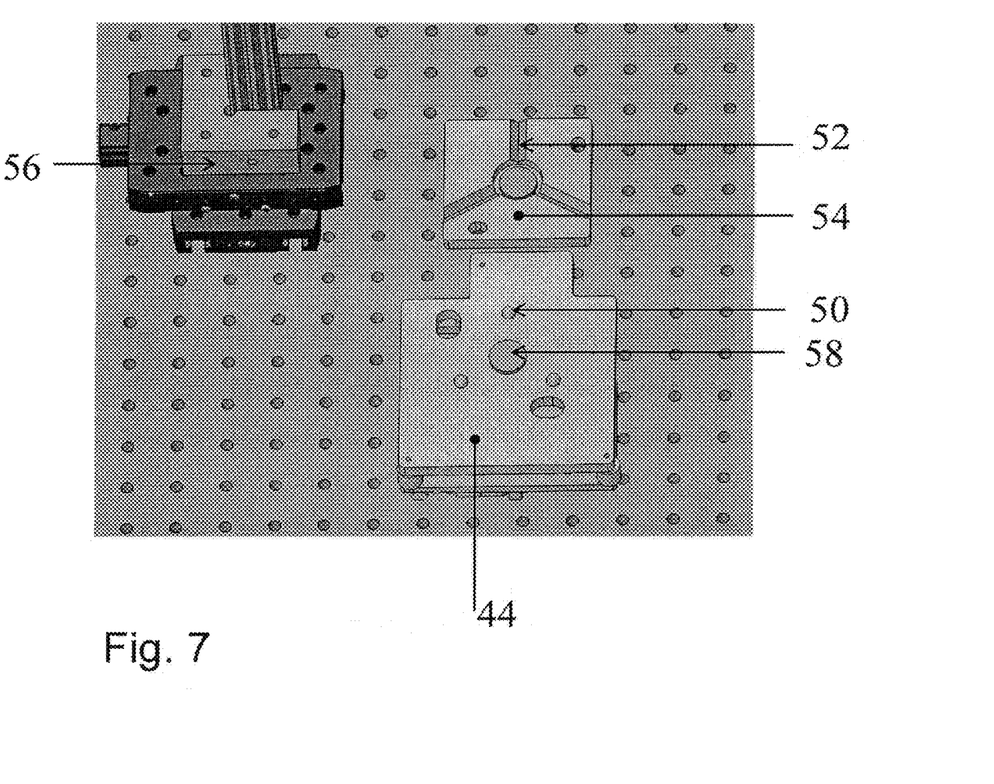
FIG. 7 is an illustration of the biaxial tensile stage while being registered to the vision system. The stage is flipped to illustrate the kinematic coupling mechanism.

In this embodiment, a '3-ball and V-groove' kinematic coupling has been used to implement a quick and repeatable attach/detach mechanism for precise registration of the stage to the metrology frame. The coupling arrangement is illustrated in FIG. 7. The kinematic coupling consists of (i) a set of three balls 50 that are affixed to the base of the stage and (ii) a set of three V grooves 52 that are fabricated into a separate plate 54 that forms part of the metrology frame. In this system, the plate 54 with the three V grooves is held stationary with respect to the X-Y stage 56 of the metrology frame. Preload to the coupling is provided by a pair of permanent magnets 58 that are attached to the two plates of the coupling. Thus, the tensile stage can be registered to the vision system by engaging the two halves of the coupling. Registration of the stage to the metrology frame involves aligning and locating the coordinate frames of the two systems with respect to each other. To enable quick registration, alignment is performed in two stages. First, an initial alignment is performed to achieve these registration requirements; then the kinematic couplings are used to maintain the registration during repeated engagement-disengagement of the tensile stage from the metrology frame.

The ability of this stage to generate patterns that are not accessible via equibiaxial strains has been demonstrated by fabricating a non-uniform zigzag wrinkled pattern that exhibits period doubling only along one axis. Additionally, the feasibility of tuning patterns is demonstrated via tuning of (i) strain states and (ii) actuation paths. This was achieved by performing a series of biaxial stretch release and stretching operations on a bilayer film that consists of a titanium thin film deposited on top of a biaxially pre-stretched PDMS film. The bilayer was fabricated by depositing a titanium film of thickness 84.2±3.3 nm on top of a stretched PDMS film via RF sputtering. The PDMS base layer was pre-stretched by sequentially stretching the film along the Y axis by 6.0% and then along the X axis by 6.0%. During stretching along the Y axis, the X axis was held "free" to allow for Poisson's contraction along the X axis. Subsequent stretching along the X axis was performed from a starting position that corresponds to a zero normal stress along X. This stress state is ensured by the zero-contact condition of the actuation mechanism.

Figure 8A:
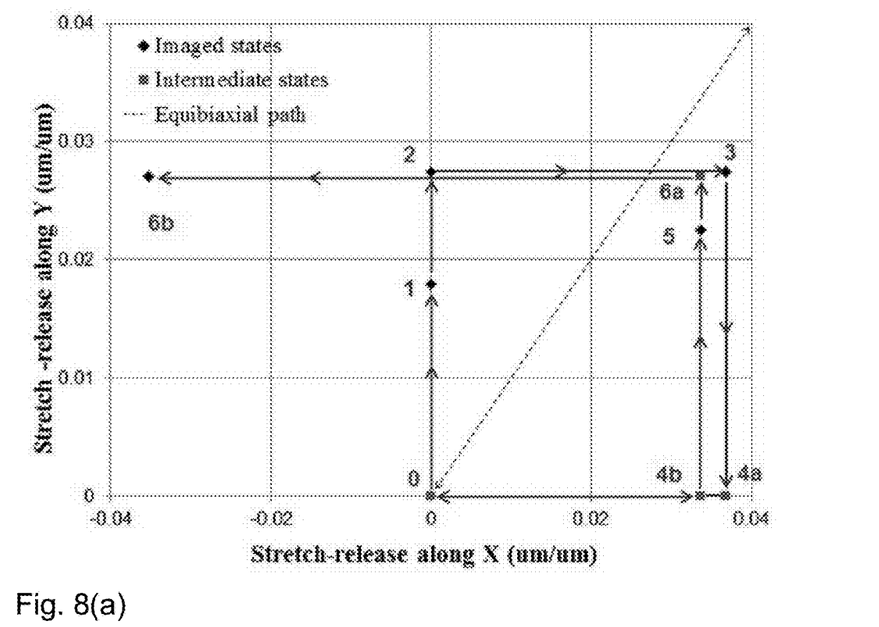
FIG. 8(a) is a sequence of stretches applied to the film.
Figure 8B:
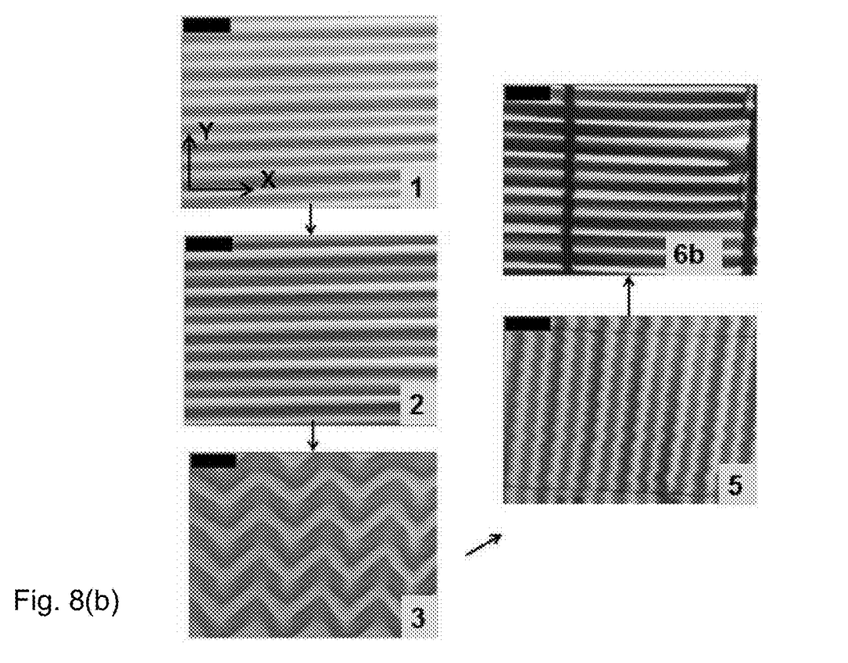
FIG. 8(b) illustrates the images of the wrinkled patterns that are generated at each step. Scale bars in the images are 30 um long.

The sequence of stretch release and stretching operations is summarized in FIG. 8(a) and the images of the corresponding patterns are illustrated in FIG. 8(b). Stretch release and stretching were performed along the following path: 0→1→2→3→4a→0→4b→5→6a→6b. During uniaxial stretch release along Y axis from state 0 to 1, one observes the formation of 1-D wrinkles that exhibit period doubling behavior. Period doubling becomes more prominent with further stretch release from state 1 to state 2. On subsequent stretch release along the X axis, one observes the formation of zigzag patterns that demonstrate period doubling along both axes. The zigzag pattern is the characteristic pattern that is generated during sequential stretch release of a pre-stretched bilayer and is generated due to in-plane buckling of the aligned 1-D wrinkles.

The patterns that are formed via wrinkling are reversible and can be tuned by changing the strain state and the actuation path. When the bilayer is stretched to bring it back from state 3 to a zero-strain state 0 via the intermediate state 4a, it is observed that the zigzag patterns transform into a flat state. Upon subsequent stretch release to state 5 via state 4b, a non-uniform zigzag pattern is obtained that has the dominant period oriented horizontally. The characteristics of this new asymmetric 2-D pattern are: (i) smaller amplitude along the Y axis and (ii) period doubling behavior along the X axis. This non-uniform zigzag pattern is formed due to the asymmetry in the effective compressive strains along the two axes. During the intermediate stretching and stretch release steps, horizontally aligned cracks arise due to a mismatch between the Poisson's ratio of PDMS and titanium. During stretch release along the Y axis, the effective compressive strain for buckling is reduced by the amount necessary for closing these cracks. This accounts for the lower amplitude along the Y axis of the zigzag patterns that are observed in state 5. Thus, this 2-D tensile stage enables fabrication and tuning of such asymmetric 2-D modes that are not accessible via equibiaxial strains.

Although the 2-D patterns that are formed via wrinkling are actuation path dependent, they are not necessarily "locked-in". This means that the wrinkle pattern changes when the strain state is changed. Thus, it is possible to tune a wrinkled pattern across different modes by changing the strain states without ever going into an intermediate flat zero-strain state. This tunability has been demonstrated by changing the strain state of the bilayers from state 5 to state 6b via state 6a. In the final state 6b, the titanium film is under tensile stretching along the X axis; this state of strain does not support wrinkle formation along the X axis. The observed wrinkled pattern in state 6b confirms this expectation as the pattern transforms from an asymmetric 2-D mode into a uniaxial 1-D mode that comprises horizontally aligned wrinkles. The tensile state of strain along the X axis can be verified by the presence of wide vertical cracks that are formed due to tensile stretching of the titanium film. These cracks can be further used to generate asymmetric 2-D modes that are not accessible via equibiaxial strains.

The present invention is a compact biaxial tensile stage that provides the means to apply accurate, large, and non-equal biaxial strains for wrinkle pattern formation. This stage can be used as (i) an experimental tool to study and characterize wrinkle formation and/or (ii) manufacturing equipment for low-cost fabrication of micro and nano scale patterns. Although biaxial tensile stages that are capable of providing large and accurate strains are commercially available, adapting such stages for wrinkle pattern formation is challenging. These challenges arise due to the need for a mobile and compact stage that can (i) fit into vacuum chambers, (ii) accurately maintain the strain during thin film generation/deposition, and (iii) readily allow for in-situ imaging, i.e., real-time imaging during stretch release. The present stage solves these challenges by (i) eliminating mechanical coupling between the actuators and the movable platforms, (ii) integrating the actuators onto the stage, and (iii) incorporating a kinematic coupling to quickly and accurately register the stage to a custom-built vision system. In this embodiment, the stage has a footprint of 131 mm×110 mm×75 mm and can provide a maximum strain of 33.5% with a resolution of 0.027% while holding an accuracy of 7 um for repeated registrations to the vision system.

The present stage may be applied to (i) study the non-uniformity in the period of wrinkles over a plasma-exposed or metal/polymer coated PDMS film, (ii) study transition of single-period sinusoidal wrinkles into the period-doubled higher mode during prestretch release at high compressive strains, and (iii) fabricate complex asymmetric 2-D wrinkled patterns that are not accessible via equibiaxial strains. As the morphology of the 2-D wrinkled pattern is determined by both the current strain state and the past strain history of the system, this strain path dependence of wrinkle pattern formation opens up a new design scheme for reconfigurable/tunable wrinkles. This stage provides the means to apply sequential unequal biaxial strains thereby enabling one to reversibly and/or irreversibly reconfigure a single bilayer system to exhibit different types of wrinkled patterns. One may apply the present stage to systematically explore and characterize this design space to fabricate and tune reconfigurable 2-D wrinkled patterns that are functionally-relevant in applications such as optical/biological sensing and microfluidics circuits.

It is recognized that modifications and variations of the present invention will be apparent to those of ordinary skill in the art and it is intended that all such modifications and variations be included within the scope of the appended claims.

What is claimed is:

1. Biaxial tensile stage comprising:
 a stationary base plate;
 a pair of movable platforms that are slidingly attached to the base plate and so oriented on the base plate as to slide perpendicular to each other;
 a pair of stationary platforms that are rigidly attached to the base plate and located opposite to the movable platforms so as to leave a gap between each pair of movable platform and stationary platform;
 a set of clamps that are slidingly attached to the movable and stationary platforms and hold a film that can be stretched across the gap between the movable platforms and the stationary platforms;
 a bearing located between each clamp bottom and a corresponding platform of the clamp;
 a pair of actuators that are rigidly attached to the base plate and are capable of pushing onto the movable platform but not capable of pulling the movable platforms so that moving the actuator sets the minimum gap between each set of movable platform and the stationary platform; and
 wherein the two actuators are capable of moving simultaneously, separately, or in sequence so as to increase or decrease the minimum gap between either or both pairs of movable and stationary platforms resulting in biaxial tensile stretching or release of the tensile stretch in the film held across the movable and stationary platforms.

2. The stage of claim 1 wherein the two actuators are capable of moving so that the displacements of the two actuators are linked to each other.

3. The stage of claim 1 wherein a coupling is affixed to the base plate to attach and detach the stage to a separate plate on a metrology frame and comprises a set of three objects that are all affixed either to the base plate or to the plate on the metrology frame, a set of three grooves that are all made on the base plate or the plate on the metrology frame so that the grooves are not made on the same plate that has the three objects, and a set of permanent magnets affixed to each of the plates so that the three objects fit into the three grooves when either plate is placed on top of the other.

4. The stage of claim 1 wherein the clamps comprise a set of two halves that when joined together leave a fixed gap between the two so that the gap is smaller than the unclamped thickness of the film and the film is held by compressing it within this gap.

5. The stage of claim 1 wherein one side of the film has raised features and the clamps have hollow features to help locate and align the film to the clamps.

6. The stage of claim 1 wherein one side of the film has hollow features and the clamps have raised features to help locate and align the film to the clamps.

7. The stage of claim 1 wherein strips of a phase change material are affixed to the surface of the stage for passive thermal management.

8. The stage of claim 1 wherein a force sensor is placed at the contact between the actuator and the moving platform to measure the contact force.

9. The stage of claim 1 wherein the actuator pushes onto the movable platform by contacting an extension arm that is rigidly attached to the movable platform.

10. The stage of claim 1 wherein the actuator is a micrometer head.

11. The stage of claim 1 wherein the sliding motion between the movable platforms and the base plate is achieved by a pair of rail and guide linear bearings.

12. The stage of claim 1 wherein the sliding motion between the clamps and the movable and fixed platforms is achieved by a set of rail and guide linear bearings.

13. The stage of claim 1 wherein the base plate is made up of multiple plates that are joined together.

* * * * *